US012690150B2

(12) United States Patent
Liu et al.

(10) Patent No.: US 12,690,150 B2
(45) Date of Patent: Jul. 21, 2026

(54) FLEXIBLE DISPLAY MODULE AND SLIDING AND ROLLING DISPLAY DEVICE

(71) Applicant: BOE TECHNOLOGY GROUP CO., LTD., Beijing (CN)

(72) Inventors: Lu Liu, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 126 days.

(21) Appl. No.: 18/697,300

(22) PCT Filed: Aug. 3, 2023

(86) PCT No.: PCT/CN2023/110976
§ 371 (c)(1),
(2) Date: Mar. 29, 2024

(87) PCT Pub. No.: WO2024/032462
PCT Pub. Date: Feb. 15, 2024

(65) Prior Publication Data
US 2024/0397652 A1 Nov. 28, 2024

(30) Foreign Application Priority Data
Aug. 9, 2022 (CN) .......................... 202210951721.5

(51) Int. Cl.
H05K 5/03 (2006.01)
(52) U.S. Cl.
CPC ..................................... H05K 5/03 (2013.01)
(58) Field of Classification Search
CPC ........................................................ H05K 5/03

USPC ......................................... 361/807, 809, 810
See application file for complete search history.

(56) References Cited

U.S. PATENT DOCUMENTS

| | | | | |
|---|---|---|---|---|
| 2016/0357052 A1* | 12/2016 | Kim | ...................... | H10K 59/87 |
| 2019/0204874 A1* | 7/2019 | Kim | ...................... | G09F 9/301 |
| 2021/0150945 A1* | 5/2021 | Youn | ..................... | G06F 1/1652 |
| 2022/0118744 A1* | 4/2022 | Ouyang | ................ | B32B 27/283 |

FOREIGN PATENT DOCUMENTS

| | | | | |
|---|---|---|---|---|
| CN | 108877529 A | 11/2018 | | |
| CN | 208444535 U | 1/2019 | | |
| CN | 209461079 U | 10/2019 | | |
| CN | 110853514 A | 2/2020 | | |
| CN | 111278643 A | 6/2020 | | |
| CN | 113470524 A | 10/2021 | | |
| CN | 115116344 A | 9/2022 | | |
| WO | 2021/159837 A1 | 8/2021 | | |
| WO | WO-2021209057 A1 * | 10/2021 | ............. | H04M 1/18 |

* cited by examiner

*Primary Examiner* — Hung S. Bui
(74) *Attorney, Agent, or Firm* — WHDA, LLP

(57) ABSTRACT

A flexible display module and a sliding and rolling display device are provided. The module includes: a flexible panel; a cover plate disposed on a displaying side of the flexible panel; and a support layer disposed on a non-displaying side of the flexible panel; where the cover plate includes a soft impact resistant layer and a rigid reinforcement layer, the soft impact resistant layer is disposed on a side of the rigid reinforcement layer away from the flexible panel, and the soft impact resistant layer has a modulus of 1 MPa to 1 Gpa, and the rigid reinforcement layer has a modulus of more than 5 Gpa.

13 Claims, 2 Drawing Sheets

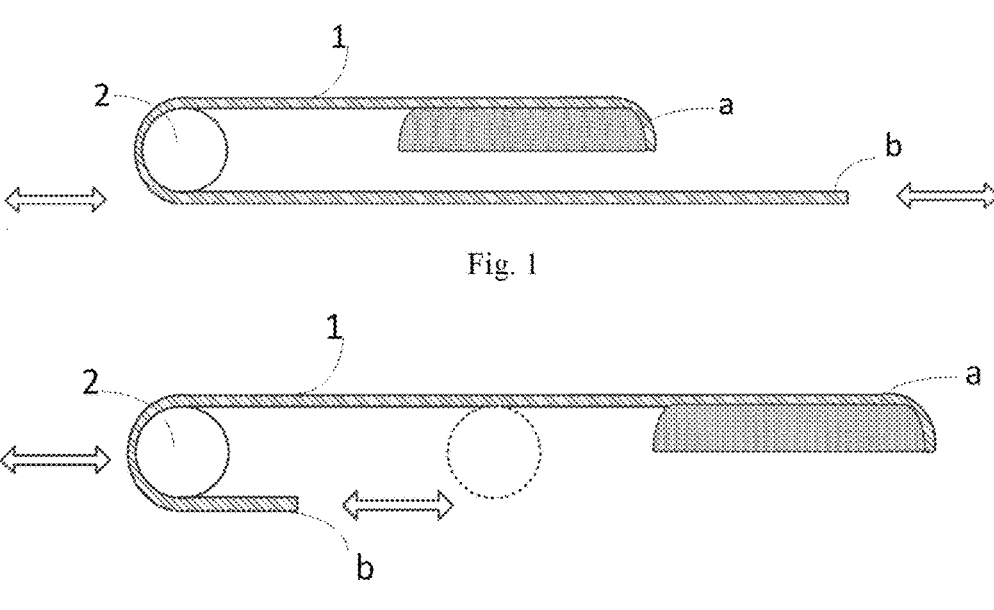
Fig. 1
Fig. 2
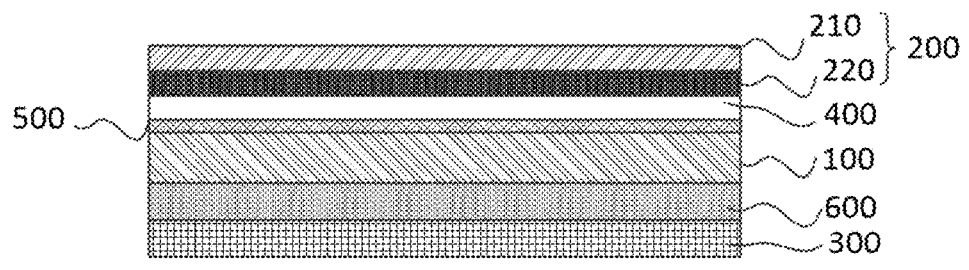
Fig. 3
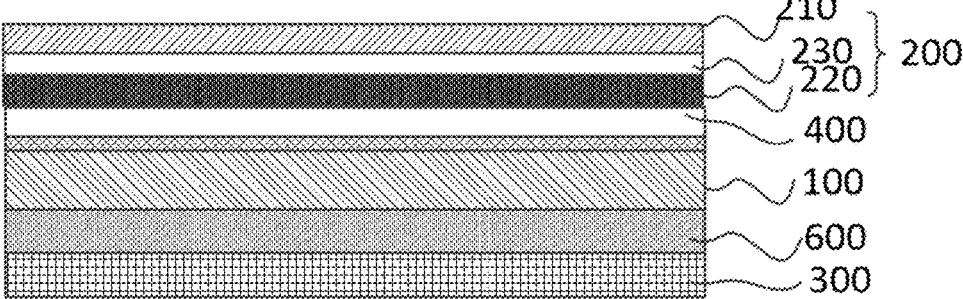
Fig. 4
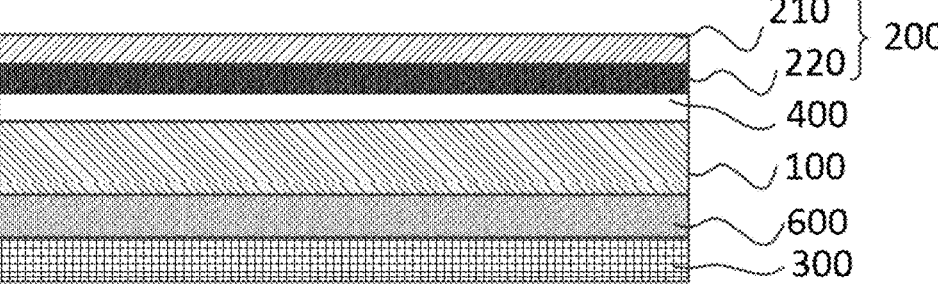
Fig. 5

FLEXIBLE DISPLAY MODULE AND SLIDING AND ROLLING DISPLAY DEVICE

CROSS-REFERENCE TO RELATED APPLICATIONS

This application is the U.S. national phase of PCT Application PCT/CN2023/110976 filed on Aug. 3, 2023, which claims priority to Chinese Patent Application No. 202210951721.5 filed in China on Aug. 9, 2022, which is herein incorporated by reference in its entirety.

TECHNICAL FIELD

The present disclosure relates to the technical field of display, and more particularly, to a flexible display module and a sliding and rolling display device.

BACKGROUND

Nowadays, flexible display panels gradually enter the consumer's field of vision, and the curlability of the screen greatly expands the applications in the display field. Compared with conventional screens, flexible screens have obvious advantages, not only are lighter and thinner in size, but also lower in power consumption than conventional devices, which helps to improve the endurance of equipment. At the same time, it is also considerably more durable than conventional screens based on its bendable and flexibility properties.

Flexible screens are generally used in display devices as folding screens or sliding and rolling screens. The folding screen needs a connection component for folding, for example, a connection shaft or a hinge structure is provided at a bend, and the design thereof is difficult and costly; in addition, the area of the display area of the sliding and rolling screen can be adjusted, and can be rolled up when not in use, so as to facilitate storage and save space. In current sliding and rolling flexible display modules, the flexible screen is usually rolled up on a roll shaft, and the display area of the flexible screen is changed by stretching and rolling up.

In the related art, on the one hand, a film layer in a bending region of a flexible display screen is required to have a bendability so as to ensure that all the film layers in the bending region are not damaged during bending, such as breaking or separating between the film layers; on the other hand, regarding the flatness of the whole module after bending, it is required that the bending part should not be "creased".

The inventors of the present disclosure have found that, unlike a folding flexible display module, a sliding and rolling flexible display module has a bend part in either display state. In the rolled-up state, the bending part is in the middle part of the module; in the slide-open state, the bend occurs at the end of the module. Therefore, for a sliding and rolling flexible display module, there is an urgent need to solve the unevenness problem caused by the following two factors: the crease produced by long time storage in the rolled-up state, bouncing at the proximal end in the sliding open or rolled-up state.

SUMMARY

Embodiments of the present disclosure provide a flexible display module and a sliding and rolling display device capable of improving the flatness of a display screen.

The technical solutions provided by the embodiments of the present disclosure are as follows.

An embodiment of the present disclosure provides a flexible display module including:

a flexible panel including a displaying side and a non-displaying side opposite the displaying side;

a cover plate disposed on the displaying side of the flexible panel; and a support layer disposed on the non-displaying side of the flexible panel;

where the cover plate includes at least one soft impact resistant layer and at least one rigid reinforcement layer, the soft impact resistant layer is disposed on a side of the rigid reinforcement layer away from the flexible panel, and the soft impact resistant layer has a modulus of 1 MPa to 1 Gpa, and the rigid reinforcement layer has a modulus of more than 5 Gpa.

Illustratively, the material of the soft impact resistant layer is a thermoplastic polyurethane elastomer rubber with a film layer thickness of 0.03 mm to 0.2 mm.

Illustratively, the material of the rigid reinforcement layer is selected from at least one of ultra-thin glass, colorless polyimide and polyethylene terephthalate, where a film layer thickness of the rigid reinforcement layer is 0.03 mm to 0.15 mm.

Illustratively, when the material of the rigid reinforcement layer is ultra-thin glass with a thickness of less than 100 mm, the film layer thickness of the rigid reinforcement layer is 0.03 mm-0.07 mm; when the material of the rigid reinforcement layer is colorless polyimide or polyethylene terephthalate, the film layer thickness of the rigid reinforcement layer is 0.03 mm to 0.15 mm.

Illustratively, the soft impact resistant layer is composited with the rigid reinforcement layer to form a composite structural film layer; or the soft impact resistant layer is adhered to the rigid reinforcement layer by a clear adhesive material, and the clear adhesive material is removable or peelable so that the soft impact resistant layer is replaceable.

Illustratively, the rigid reinforcement layer is adhered to the displaying side of the flexible panel via an optical clear adhesive layer.

Illustratively, the optical clear adhesive layer has a modulus of 20 KPa to 100 MPa.

Illustratively, the support layer has a modulus of 0.3 MPa to 10 Mpa.

Illustratively, the area percentage of the mesh pattern in the support layer is greater than or equal to 40%.

Illustratively, the support layer is made of a hard material and distributed in a mesh pattern.

Illustratively, the hard material includes at least one of a metallic material or a carbon fiber.

Illustratively, the flexible display module further includes an anti-reflection sheet located between the cover plate and the flexible panel, where the anti-reflection sheet includes a substrate and an anti-reflection functional film formed on the substrate; or the flexible display module further includes an anti-reflection functional film integrated on a side of the cover plate near the flexible panel using the cover plate as a substrate; or the flexible display module further includes an anti-reflection functional film integrated on the displaying side of the flexible panel using the flexible panel as a substrate.

Illustratively, the anti-reflection sheet is a polarizer; or the anti-reflection functional film is a polarizing functional layer.

Illustratively, the flexible display module further includes: a neutral layer adjustment layer, where the neutral layer adjustment layer is located between the support layer and the flexible panel, or the neutral layer adjustment layer is integrated on a side of the support layer near the flexible panel, and/or the non-displaying side of the flexible panel; or the support layer is directly connected to the non-displaying side of the flexible panel, and the stresses of the flexible panel and all the film layers located on the side of the displaying side of the flexible panel are matched, to enable a predetermined film layer in the flexible display module to be in a stress neutral layer position.

An embodiment of the present disclosure further provides a sliding and rolling display device including the flexible display module provided by the embodiments of the present disclosure.

The embodiments of present disclosure has the following beneficial effects.

In the flexible display module and the sliding and rolling display device of the embodiments of the present disclosure, the stack structure of the module includes a cover plate, a flexible panel and a support layer stacked in sequence, where the cover plate adopts a double-layer or multi-layer structure combining at least one soft impact resistant layer and at least one rigid reinforcement layer, and the soft impact resistant layer has a modulus of 1 MPa to 1 Gpa, and the rigid reinforcement layer has a modulus of more than 5 Gpa. In this way, the soft impact resistant layer can resist the external impact and improve the impact resistant performance of the whole module; the rigid reinforcement layer has a strong stiffness so that the flexible display module has texture. Furthermore, when the module is applied to a sliding and rolling display module, the use of such cover plate with a rigid-flexible combination can simultaneously improve the problems of bouncing at the proximal end and creasing.

BRIEF DESCRIPTION OF THE DRAWINGS

FIG. 1 is a schematic view of a sliding and rolling display module in a rolled-up state;

FIG. 2 is a schematic view of a sliding and rolling display module in an unfolded state:

FIG. 3 shows a schematic view of a stack structure of a display module in some embodiments of the present disclosure;

FIG. 4 shows a schematic view of a stack structure of a display module in further embodiments of the present disclosure;

FIG. 5 shows a schematic view of a stack structure of a display module in further embodiments of the present disclosure:

Figure 6:
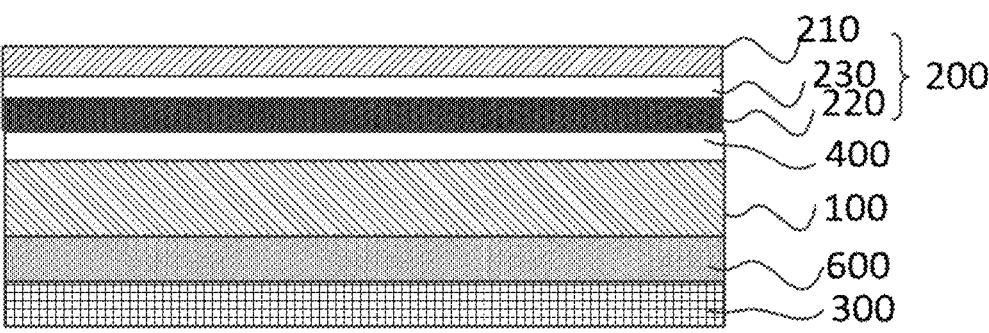
FIG. 6 shows a schematic view of a stack structure of a display module in further embodiments of the present disclosure.

In the figures, the reference numerals are as follows: flexible panel 100; cover plate 200; support layer 300; soft impact resistant layer 210; rigid reinforcement layer 220; clear adhesive material 230; optical clear adhesive layer 400; anti-reflection sheet 500; neutral layer adjustment layer 600.

DETAILED DESCRIPTION

In order to make the objects, technical solutions and advantages of the embodiments of the present disclosure clearer, the technical solutions of the embodiments of the present disclosure will be described clearly and completely by reference to the accompanying drawings of the embodiments of the present disclosure. It is to be understood that the described embodiments are part, but not all, of the disclosed embodiments. Based on the embodiments described in the present disclosure, all other embodiments obtained by a person of ordinary skill in the art without creative effort fall within the scope of the present disclosure.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. Likewise, terms such as "a", "an", or "the" do not denote a limitation of quantity, but rather denote the presence of at least one of the referenced item. The terms "including" or "includes", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

Before describing the flexible display module and the sliding and rolling display device provided by the embodiments of the present disclosure in detail, it is necessary to describe the related art as follows.

In order to achieve a flexible form, each film layer material of the flexible display module needs to have deformable properties, such as being bendable. However, the materials with better bending performance are generally plastic materials, or an ultra-thin glass materials, or a metallic materials with a thickness of less than 0.05 mm. However, these materials are subject to plastic deformation after a long time bending, resulting in creasing.

In the related art, as shown in FIGS. 1 and 2, a sliding and rolling display module is generally a portion between a leading end a and a trailing end b of a flexible panel 1, which is attached to an outer periphery of a roll shaft 2, and changes a display area of the flexible screen 1 by stretching and rolling-up. In particular, as shown in FIGS. 1 and 2, the flexible screen 1 can be caused to unfold when a pulling force in the opposite direction is applied to the leading end a and the roll shaft 2; the flexible screen 1 can be partially rolled up when a pulling force in the opposite direction is applied to the leading end a and the roll shaft 2.

Unlike a folding flexible display module, in any display state, a bending part exists in the sliding and rolling display module, namely, a part of the flexible screen 1 is always fitted and bent with the roll shaft 2. As shown in FIG. 1, in the rolled-up state, the bending part is in the middle part of the module; as shown in FIG. 2, in the slide-open state, the bending occurs at the trailing end b of the module, and the trailing end b is the proximal end. Therefore, for a sliding and rolling flexible display module, it is necessary to solve the unevenness problem in the following two aspects: firstly, the crease is produced by long time storage in the rolled-up state; secondly, the proximal end bounces in a slide-open or rolled-up state. For the sliding and rolling display module, it is necessary to consider both the crease and the bounce at the proximal end.

In order to solve the above problems, the inventors of the present disclosure have studied and found the following.

For the bounce phenomenon at the proximal end, the degree of stiffness (modulus) of the module is the main factor affecting the bounce height at the proximal end. When the bounce height of the proximal end of the sliding and rolling display module is less than 1 mm in order to achieve the degree of visual inconspicuous visible. The stronger the rigidity of the module, the greater the bounce height of the proximal end. The lower the rigidity of the module, the lower the bounce height of the proximal end. Therefore, materials with low modulus should be selected when the module is designed. However, for the creasing phenomenon, materials with low modulus are more prone to plastic deformation and creasing than materials with high modulus. Therefore, a low module modulus is required for a low bounce height of the proximal end; a high module modulus is required for a high bounce height of the proximal end. In other words, in order to improve the phenomenon of creasing and bouncing at the proximal end of the sliding and rolling display module, the requirement for the module modulus becomes a contradiction.

In the related art, in the whole flexible display module, films thereof are mainly divided into two major categories: the first category is a film layer with required optical properties, which is located at the displaying side of the flexible panel, and needs to meet the folding requirements, and also needs to have a certain impact resistance so as to ensure the falling ball and falling pen test characteristics of the module; the second category is a film layer which has no requirement for optical performance and is located on the non-displaying side of the flexible panel, and plays the role of adjusting strain, process support, etc. Taking a stack structure of a sliding and rolling display module as an example, the sliding and rolling display device may include a support layer, a neutral layer adjustment layer, a flexible panel, an adhesive connecting layer and a flexible cover plate which are sequentially stacked, where the main function of the flexible cover plate is to protect the flexible display module from external impacts, such as falling balls, falling pens, friction, scratches, ultraviolet rays, organic solvents and greases, and other impacts. Therefore, the cover plate is required to have a certain strength and thickness in combination with good scratch resistance properties. In the related art, a flexible cover plate is generally coated with a hardened layer on a flexible film, where the flexible film can have an impact resistance and the hardened layer can have a scratch resistance.

The current sliding and rolling display module cannot solve the above-mentioned requirements for the module modulus, and cannot simultaneously improve the crease and bounce at the proximal end.

In order to solve the above-mentioned problems, an embodiment of the present disclosure provides a flexible display module, as shown in FIGS. 3-9, including:

a flexible panel 100 including a displaying side and a non-displaying side opposite the displaying side;

a cover plate 200 disposed on the displaying side of the flexible panel 100; and a support layer 300 disposed on the non-displaying side of the flexible panel 100;

where the cover plate 200 includes at least one soft impact resistant layer 210 and at least one rigid reinforcement layer 220, the soft impact resistant layer 210 is disposed on a side of the rigid reinforcement layer 220 away from the flexible panel 100, and the soft impact resistant layer 210 has a modulus of 1 MPa to 1 Gpa, and the rigid reinforcement layer 220 has a modulus of more than 5 Gpa.

In the above-mentioned solution, the cover plate 200 of the flexible display module adopts a rigid-flexible combined multi-layer structure in which at least one soft impact resistant layer 210 and at least one rigid reinforcement layer 220 are combined, the soft impact resistant layer 210 has a modulus of 1 MPa to 1 Gpa, in other words, the soft impact resistant layer 210 is an ultra-soft impact resistant layer; the rigid reinforcement layer 220 has a modulus of more than 5 Gpa. In this way, the soft impact resistant layer 210 can resist external impact and improve the impact resistance performance of the whole module; the rigid reinforcement layer 220 has a strong stiffness so that the flexible display module has texture. Furthermore, when the module is applied to a sliding and rolling display module, the use of such cover plate 200 with a rigid-flexible combination can simultaneously improve the problems of creasing and bouncing at the proximal end.

As some exemplary embodiments, the material of the soft impact resistant layer 210 is an organic material, such as transparent thermoplastic polyurethane elastomer rubber (TPU) with a film layer thickness of 0.03 mm to 0.2 mm.

As some exemplary embodiments, the material of the rigid reinforcement layer 220 is selected from at least one of ultra-thin glass having a thickness of less than 100 μm, colorless polyimide, or polyethylene terephthalate, where a film layer thickness of the rigid reinforcement layer 220 is 0.03 mm to 0.15 mm. Illustratively, when the material of the rigid reinforcement layer 220 is ultra-thin glass having a thickness of less than 100 μm, t the film layer thickness of the rigid reinforcement layer is 0.03 mm to 0.07 mm; when the material of the rigid reinforcement layer 220 is colorless polyimide or polyethylene terephthalate, the film layer thickness of the rigid reinforcement layer is 0.03 mm to 0.15 mm.

It is, of course, understood that the above is an example of the material and the film layer thickness of the soft impact resistant layer 210 and the rigid reinforcement layer 220. In practical applications, the material and the film layer thickness of the soft impact resistant layer 210 and the rigid reinforcement layer 220 are not limited thereto.

As some exemplary embodiments, as shown in FIG. 3, the combination between the soft impact resistant layer 210 and the rigid reinforcement layer 220 may be such that the soft impact resistant layer 210 is composited with the rigid reinforcement layer 220 to form a composite structural film layer.

In other embodiments, as shown in FIG. 4, it is also possible that the soft impact resistant layer 210 is adhered to the rigid reinforcement layer 220 by a clear adhesive material 230, and the clear adhesive material 230 is removable or peelable so that the soft impact resistant layer 210 is replaceable. That is, the soft impact resistant layer 210 may be separated from the rigid reinforcement layer 220. The purpose of this arrangement is that, the soft impact resistant layer 210 is made of an organic material having poor scratch resistance properties and being subject to plastic deformation, thus the soft impact resistant layer 210 is adhered to in a manner separable from the rigid reinforcement layer 220, and the soft impact resistant layer 210 can be replaced, thereby improving both the scratch and plastic deformation problems.

Further, as some exemplary embodiments, the rigid reinforcement layer 220 is adhered to the displaying side of the flexible panel 100 by an optical clear adhesive (OCA) layer 400. Illustratively, the optical clear adhesive layer has a modulus of 20 KPa to 100 MPa. The optical clear adhesive layer 400 can also meet both optical performance requirements and flexibility requirements when the cover plate 200 is attached to the flexible panel 100.

In addition, on the one hand, the support layer 300 can be used as a layer in a flexible display module structure to satisfy the requirements of flexible forms; on the other hand, the support layer 300 also plays the role of connecting with the whole machine, i.e. external forces such as tensile force, pushing force and support of the whole machine to the module can be transmitted to the inside of the module through the support layer 300. As some exemplary embodiments, the support layer 300 may have a modulus in the range of 0.3 MPa to 10 Mpa, such that the support layer 300 has a reduced modulus compared to the related art and may be combined with the modulus of the cover plate with a rigid-flexible combination, so as to further improve the creasing of the whole module and bounce at the proximal shaft.

In one exemplary embodiment, the support layer 300 is made of a hard material and is distributed in a mesh pattern. Illustratively, an area of the mesh pattern is more than 40% of the total area of the support layer. The flexible panel includes a curling region which will be curled during the rolling-up and unfolded process, and the front projection of the mesh pattern on the flexible panel covers at least part of the curling region, i.e., the mesh pattern is disposed at least corresponding to the sliding and rolling part of the sliding and rolling display module.

Illustratively, the hard material includes a metallic material or a carbon fiber or the like. That is, the support layer 300 may be a metal mesh or carbon fiber mesh structure, and such an arrangement may achieve the purpose of reducing the modulus of the support layer 300 to further improve the problem of bouncing at the proximal end. It will of course be appreciated that in practice, the material of the support layer 300 is not limited to metallic materials or carbon fibers, and other materials or structures may be selected for the purpose of reducing the modulus to between 0.3 MPa to 10 Mpa.

Further, in some exemplary embodiments, as shown in FIG. 3, the flexible display module further includes an anti-reflection sheet 500 disposed between the cover plate 200 and the flexible panel 100, the anti-reflection sheet 500 includes a substrate and an anti-reflection functional film formed on the substrate. The anti-reflection sheet 500 may be a circular polarizer. In this embodiment, the anti-reflection sheet 500 is a single layer disposed between the cover plate 200 and the flexible panel 100.

In other embodiments, the flexible display module further includes an anti-reflection functional film integrated on a side of the cover plate 200 near the flexible panel 100 using the cover plate 200 as a substrate, or the flexible display module further includes an anti-reflection functional film integrated on a displaying side of the flexible panel 100 using the flexible panel 100 as a substrate. That is, as shown in FIGS. 5 and 6, in the present embodiment, by using a COE (color filter on encapsulation) technology, an anti-reflection functional film is integrated on the cover plate 200, or an anti-reflection functional film is integrated on the flexible panel 100. In the above-mentioned aspect, the anti-reflection sheet 500 may be removed, and an anti-reflection functional layer may be integrated on the cover plate 200 or the flexible panel 100. In this way, in comparison with the case where an anti-reflection sheet 500 is separately disposed directly between the cover plate 200 and the flexible panel 100, since the substrate of the anti-reflection sheet 500 is generally an organic material, the plastic deformation of the organic material may be further reduced by removing the substrate, thereby achieving the effect of reducing creases.

It should be noted that, the anti-reflection functional film refers to a polarizing functional layer having a polarizing function that can be formed on a substrate, taking the example that the anti-reflection functional film functions as polarizing.

Further, as shown in FIGS. 3 and 4, in some exemplary embodiments, the flexible display module further includes: a neutral layer adjustment layer 600 disposed between the support layer 300 and the flexible panel 100. The neutral layer adjustment layer 600 functions to adjust the position of the stress neutral layer during bending, thereby adjusting the strain of a predetermined film layer in the flexible panel 100 during bending, thereby protecting the function of the predetermined film layer on the flexible panel 100. At the same time, the neutral layer adjustment layer 600 play a supporting role in the process.

It should be noted that, the flexible panel 100 may include a display function layer and a touch control function layer, and the display function layer includes a display device and a display driving circuit, etc. The touch functional layer may include a touch pattern and a touch signal line. The predetermined film layer refers to a key film layer, such as the display function layer or the touch control function layer, etc., in the flexible panel 100 to realize its display function and/or touch control function. In the above embodiment, the neutral layer adjustment layer 600 is separately disposed between the support layer 300 and the flexible panel 100.

Figure 7:
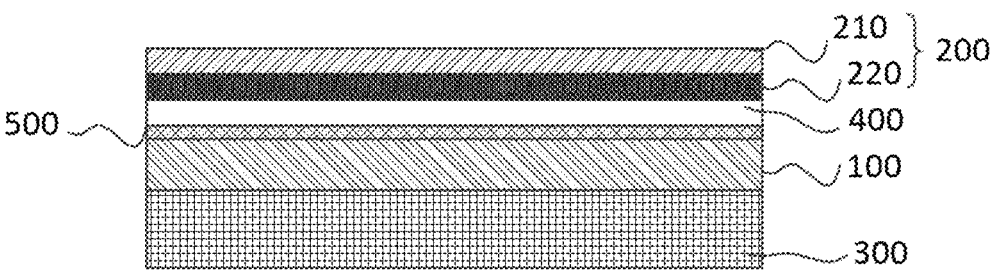
FIG. 7 shows a schematic view of a stack structure of a display module in further embodiments of the present disclosure.
Figure 8:
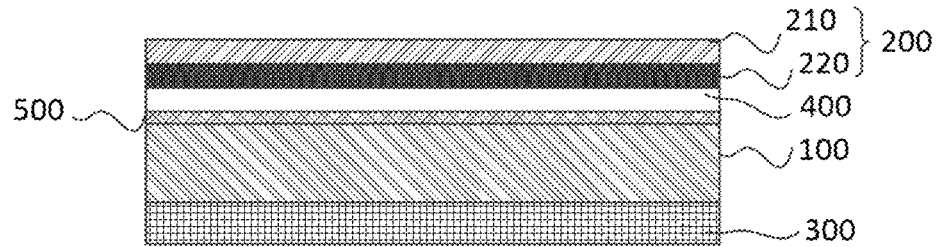
FIG. 8 shows a schematic view of a stack structure of a display module in further embodiments of the present disclosure.

In other embodiments, as shown in FIGS. 7 and 8, the neutral layer adjustment layer 600 may also be integrated into the side of the support layer 300 adjacent to the flexible panel 100, and/or the non-displaying side of the flexible panel 100.

Figure 9:
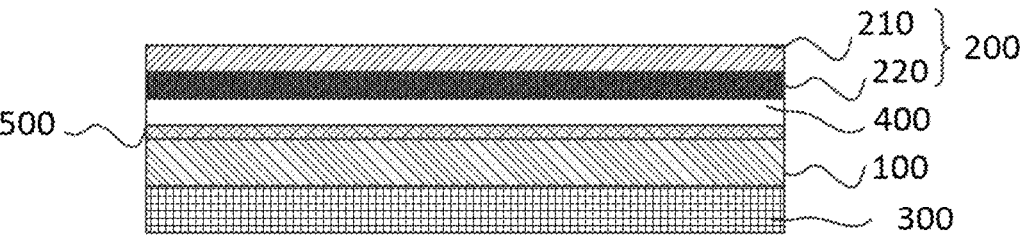
FIG. 9 shows a schematic view of a stack structure of a display module in further embodiments of the present disclosure.

In still other embodiments, as shown in FIG. 9, the support layer 300 is directly connected to the non-displaying side of the flexible panel 100, and the stress of the flexible panel 100 and all of the film layers on the displaying side of the flexible panel 100 are matched, to enable a predetermined film layer in the flexible display module to be in a stress neutral layer position. In this embodiment, the neutral layer adjustment layer 600 is eliminated, and the strain of key film layers in the flexible panel 100 is adjusted through the stress matching of the flexible panel 100 and all the film layers located on the displaying side of the flexible panel 100. In this way, since the base material of the neutral layer adjustment layer 600 is an organic material, eliminating the material of the neutral layer adjustment layer 600 can further reduce the plastic deformation of the organic material, with the effect of reducing creases.

The material of the neutral layer adjustment layer 600 may be an organic material such as PI material, which may be used as a back film of the flexible panel 100.

The flexible panel may include, but is not limited to, a flexible OLED display panel.

It should be noted that FIGS. 3 to 9 illustrate only a few embodiments of the present disclosure, and it should be understood that the embodiments of the present disclosure may also include any combination of the above embodiments.

As an example of the application of the flexible display module in some embodiments of the present disclosure to a sliding and rolling display device, the flexible display module is wound up several times for testing. The test results are as follows: the bounce force of the whole module is less than 4 N (when the bending radius R is 5 mm), the bounce height is less than 0.7 mm, and the crease height is less than 0.5 mm.

It can be seen therefrom that when the module is applied to a sliding and rolling display module, the use of such cover plate 200 with a rigid-flexible combination can improve the problems of creasing and bouncing at the proximal end at the same time.

In addition, embodiments of the present disclosure also provide a sliding and rolling display device including the flexible display module provided by embodiments of the present disclosure.

It should be noted that the flexible display module provided by the embodiments of the present disclosure is not limited to being applied to a sliding and rolling display device, can also be applied to other flexible mode display products, such as, a folding display device, a bending display device, etc.

The following points need to be explained.

(1) The drawings relate only to the structures to which the embodiments of the present disclosure relate, and other structures may refer to general designs.

(2) In the drawings used to describe embodiments of the present disclosure, the thickness of layers or regions is enlarged or reduced for clarity, i.e. the drawings are not to actual scale. It should be understood that when an element such as a layer, film, region or substrate is referred to be disposed "on" or "under" another element, it can be "directly" disposed "on" or "under" the other element or intervening elements may be present.

(3) Without conflict, embodiments of the present disclosure and features of the embodiments may be combined with each other to provide new embodiments.

The foregoing is directed to particular embodiments of the present disclosure, but the scope of the disclosure is not limited thereto, and the scope of the disclosure is defined by the appended claims.

What is claimed is:

1. A flexible display module, comprising:
a flexible panel, wherein the flexible panel comprises a displaying side and a non-displaying side opposite the displaying side;
a cover plate, wherein the cover plate is disposed on the displaying side of the flexible panel; and
a support layer, wherein the support layer is disposed on the non-displaying side of the flexible panel;
wherein the cover plate comprises at least one soft impact resistant layer and at least one rigid reinforcement layer, the soft impact resistant layer is disposed on a side of the rigid reinforcement layer away from the flexible panel, and the soft impact resistant layer has a modulus of 1 MPa to 1 Gpa, and the rigid reinforcement layer has a modulus of more than 5 Gpa;
wherein the material of the soft impact resistant layer is a thermoplastic polyurethane elastomer rubber with a film layer thickness of 0.03 mm to 0.2 mm;
wherein the material of the rigid reinforcement layer is selected from at least one of ultra-thin glass, colorless polyimide or polyethylene terephthalate, wherein a film layer thickness of the rigid reinforcement layer is 0.03 mm to 0.15 mm.

2. The flexible display module according to claim 1, wherein
when the material of the rigid reinforcement layer is ultra-thin glass with a thickness of less than 100 μm, the film layer thickness of the rigid reinforcement layer is 0.03 mm-0.07 mm;
when the material of the rigid reinforcement layer is colorless polyimide or polyethylene terephthalate, the film layer thickness of the rigid reinforcement layer is 0.03 mm to 0.15 mm.

3. The flexible display module according to claim 1, wherein
the soft impact resistant layer is composited with the rigid reinforcement layer to form a composite structural film layer; or
the soft impact resistant layer is adhered to the rigid reinforcement layer by a clear adhesive material, and the clear adhesive material is removable or peelable so that the soft impact resistant layer is replaceable.

4. The flexible display module according to claim 1, wherein
the rigid reinforcement layer is adhered to the displaying side of the flexible panel via an optical clear adhesive layer.

5. The flexible display module according to claim 4, wherein
the optical clear adhesive layer has a modulus of 20 KPa to 100 MPa.

6. The flexible display module according to claim 1, wherein
the support layer has a modulus of 0.3 MPa to 10 Mpa.

7. The flexible display module according to claim 6, wherein
the support layer is made of a hard material and distributed in a mesh pattern.

8. The flexible display module according to claim 7, wherein
an area percentage of the mesh pattern in the support layer is greater than or equal to 40%.

9. The flexible display module according to claim 7, wherein
the hard material includes at least one of a metallic material or a carbon fiber.

10. The flexible display module according to claim 1, wherein
the flexible display module further comprises an anti-reflection sheet disposed between the cover plate and the flexible panel, and the anti-reflection sheet comprises a substrate and an anti-reflection functional film formed on the substrate; or
the flexible display module further comprises: an anti-reflection functional film integrated on a side of the cover plate near the flexible panel using the cover plate as a substrate; or
the flexible display module further comprises: an anti-reflection functional film integrated on the displaying side of the flexible panel using the flexible panel as a substrate.

11. The flexible display module according to claim 10, wherein
the anti-reflection sheet is a polarizer; or the anti-reflection functional film is a polarizing functional layer.

12. The flexible display module according to claim 1, wherein

11 the flexible display module further comprises: a neutral layer adjustment layer, wherein the neutral layer adjustment layer is disposed between the support layer and the flexible panel, or the neutral layer adjustment layer is integrated on a side of the support layer near the flexible panel, and/or the non-displaying side of the flexible panel; or the support layer is directly connected to the non-displaying side of the flexible panel, and the stresses of the flexible panel and all the film layers located on the displaying side of the flexible panel are matched, to enable a predetermined film layer in the flexible display module to be in a stress neutral layer position.

13. A sliding and rolling display device, comprising: the flexible display module as claimed in claim 1.

* * * * *